US008825416B2

(12) United States Patent
Arya et al.

(10) Patent No.: US 8,825,416 B2
(45) Date of Patent: Sep. 2, 2014

(54) SYSTEMS AND METHODS FOR PHASE IDENTIFICATION

(75) Inventors: Vijay Arya, Bangalore (IN); Venkatesan T. Chakaravarthy, New Delhi (IN); Kejitan J. Dontas, Bangalore (IN); Stephen T. Hoy, Freshwater (AU); Jayant R. Kalagnanam, Tarrytown, NY (US); Shivkumar Kalyanaraman, Bangalore (IN); Christopher J. Pavlovski, Brisbane (AU); Devasenapathi P. Seetharamakrishnan, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 247 days.

(21) Appl. No.: 13/036,628

(22) Filed: Feb. 28, 2011

(65) Prior Publication Data

US 2012/0221265 A1    Aug. 30, 2012

(51) Int. Cl.
*G01R 21/00* (2006.01)
*G01R 21/06* (2006.01)

(52) U.S. Cl.
USPC ................................ 702/61; 702/72; 702/73

(58) Field of Classification Search
CPC ....................................................... G01R 29/18
USPC .......... 702/61, 73; 324/126–127, 103 R, 142; 340/637, 870.02
See application file for complete search history.

(56) References Cited

U.S. PATENT DOCUMENTS

| 4,199,798 | A | 4/1980 | Leppke |
| 4,453,122 | A | 6/1984 | Johnson |
| 5,510,700 | A | 4/1996 | Pomatto |
| 5,617,329 | A | 4/1997 | Allison |
| 6,628,009 | B1 | 9/2003 | Chapel |
| 6,642,700 | B2 * | 11/2003 | Slade et al. ..................... 324/66 |
| 7,031,859 | B2 * | 4/2006 | Piesinger ....................... 702/72 |
| 7,161,345 | B2 | 1/2007 | Bruno |
| 7,372,246 | B2 | 5/2008 | Marsden |
| 7,598,720 | B2 | 10/2009 | Veroni |
| 8,159,210 | B2 * | 4/2012 | de Buda et al. ........... 324/103 R |
| 8,212,395 | B2 * | 7/2012 | Jansma ........................ 307/38 |
| 2002/0101231 | A1 * | 8/2002 | Staats .......................... 324/126 |
| 2006/0049819 | A1 | 3/2006 | Bruno |
| 2010/0007336 | A1 * | 1/2010 | de Buda ....................... 324/127 |
| 2010/0060259 | A1 | 3/2010 | Vaswani |
| 2010/0134089 | A1 * | 6/2010 | Uram et al. .................... 324/66 |
| 2010/0164473 | A1 | 7/2010 | Caird |
| 2010/0237852 | A1 | 9/2010 | Tazzari |
| 2010/0262393 | A1 * | 10/2010 | Sharma et al. ................ 702/79 |
| 2011/0010118 | A1 * | 1/2011 | Gaarder ........................ 702/60 |
| 2011/0130992 | A1 * | 6/2011 | Kolwalkar et al. ............. 702/72 |

* cited by examiner

*Primary Examiner* — John Breene
*Assistant Examiner* — Stephanie Bloss
(74) *Attorney, Agent, or Firm* — Ference & Associates LLC

(57) ABSTRACT

Described herein are methods, systems, apparatuses and products for phase determination in an electricity grid. An aspect provides for determining phase for at least one electric grid device via receiving power consumption measurements derived from electricity grid devices connected in the electricity grid, comparing, over a series of time intervals, a total power consumed; and determining a phase for at least one electricity grid device.

25 Claims, 12 Drawing Sheets

| Time (min) | Homes (Wh) | | | | | | Phases (Wh) | | |
|---|---|---|---|---|---|---|---|---|---|
| | H1 | H2 | H3 | H4 | H5 | H6 | A | B | C |
| (0, 10] | 2 | 3.5 | 1 | 2.5 | 4.5 | 4 | 5.5 | 1 | 11 |
| (10, 20] | 3 | 3 | 10 | 5.5 | 7 | 1.5 | 6 | 10 | 14 |
| (20, 30] | 5 | 1 | 2.3 | 2.4 | 9 | 8 | 6 | 2.3 | 19.4 |
| ... | ... | ... | ... | ... | ... | ... | ... | ... | ... |

FIG. 3

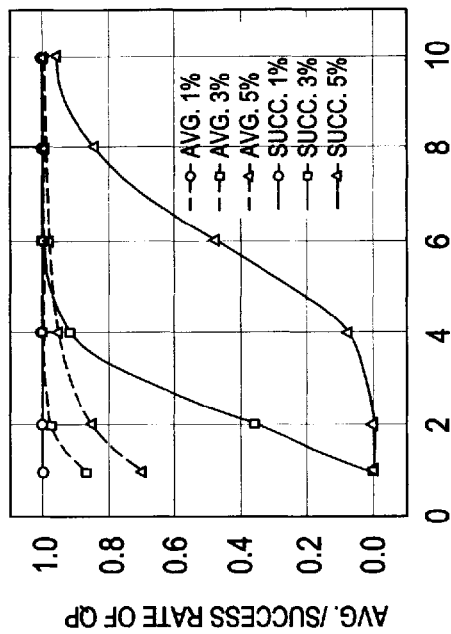
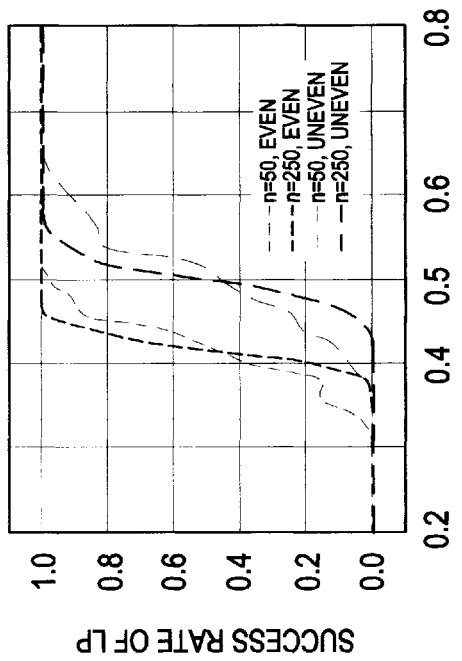
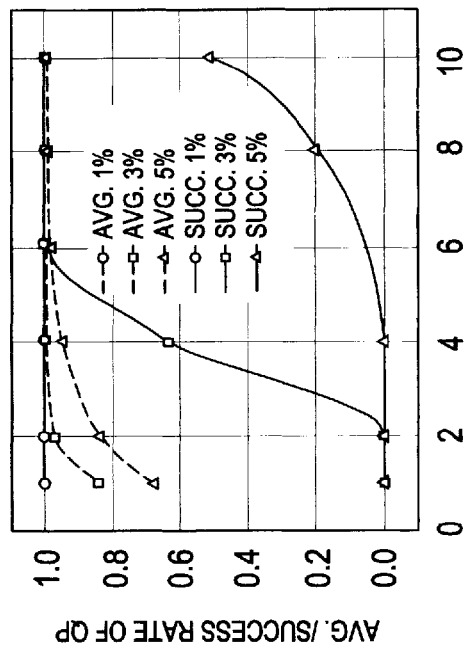
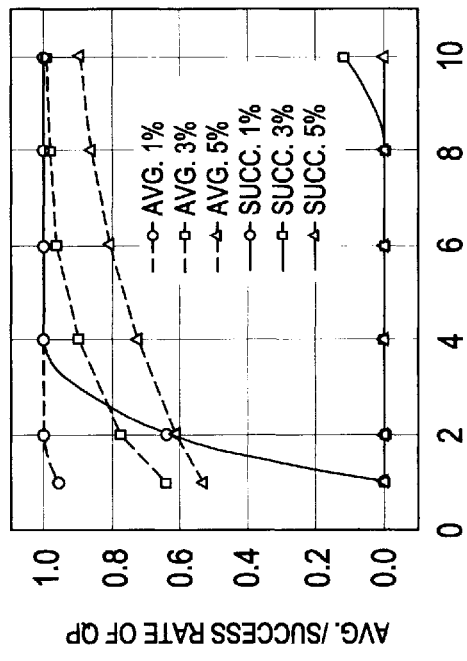
FIG. 7A
FIG. 7B
FIG. 7C
FIG. 7D

SYSTEMS AND METHODS FOR PHASE IDENTIFICATION

FIELD OF THE INVENTION

The subject matter presented herein generally relates to determining phase in an electricity grid.

BACKGROUND

In an electricity grid, the electricity is produced at very high voltage and injected into a transmission network. An electricity transmission network typically consists of high voltage circuits that supply power to transformer substations that step down voltage progressively until delivering this power via distribution networks to the household or building.

The electricity distribution network generally comprises a system having two parts, primary and secondary. The primary distribution system consists of overhead lines or underground cables, which are called feeders. The feeders run along the streets and supply the Low Voltage Transformers (LVT) that step the voltage down from the primary level (2.4-34.5 kV) to the secondary level (120-480 V). The secondary distribution system contains overhead lines or underground cables that connect the LVTs and the consumer households. Usually an LVT powers up to about 200 households and each of those households gets connected to a single phase (A, B or C). In a three-phase system, three feeders carry three alternating currents (of the same frequency) which reach their instantaneous peak values at different times.

Smart grids refer to electricity grids (ranging from generation, transmission, distribution or customer domains) that are increasingly instrumented, allowing them to achieve higher levels of observability and controllability for various economic or policy purposes. Automated monitoring and control in electricity grids has traditionally been done in the high voltage transmission network portion of the grid. More recently the medium and low voltage networks have begun to be instrumented with intelligent monitoring and control devices that report in real-time on the electrical behavior of the network. Energy distributors have commenced upgrades of manually read analogue household meters with automated smart meters that communicate meter readings with greater frequency back to the distributors. These initiatives form the basis of many smart grid transformations that energy distributors are undertaking, and in turn, result in an expectation of better understanding of long-term, intractable problems related to electricity grids.

BRIEF SUMMARY

One aspect provides a computer program product for phase determination in an electricity grid comprising: a computer readable storage medium having computer readable program code embodied therewith, the computer readable program code comprising: computer readable program code configured to access power consumption measurements derived from a supply electricity grid device that distributes power at a plurality of phases; computer readable program code configured to access power consumption measurements derived from a set of demand electricity grid devices connected in the electricity grid to the supply electricity grid device; computer readable program code configured to determine a phase of at least one demand electricity grid device in the set of demand electricity grid devices via comparing, over a series of time intervals, a total power consumed from the supply electricity grid device with power consumed by the set of demand electricity grid devices; and computer readable program code configured to output a determined phase for at least one demand electricity grid device in the set of demand electricity grid devices.

Another aspect provides a method for phase determination in an electricity grid comprising: receiving at a computing device power consumption measurements derived from a supply electricity grid device that distributes power at a plurality of phases; receiving at the computing device power consumption measurements derived from a set of demand electricity grid devices connected in the electricity grid to the supply electricity grid device; determining with the computing device a phase of at least one demand electricity grid device in the set of demand electricity grid devices via comparing, over a series of time intervals, a total power consumed from the supply electricity grid device with power consumed by the set of demand electricity grid devices; and outputting with the computing device a determined phase for at least one demand electricity grid device in the set of demand electricity grid devices.

A further aspect provides a system for phase determination in an electricity grid comprising: at least one processor; and a memory device operatively connected to the at least one processor; wherein, responsive to execution of program instructions accessible to the at least one processor, the at least one processor is configured to: access power consumption measurements derived from a supply electricity grid device that distributes power at a plurality of phases; access power consumption measurements derived from a set of demand electricity grid devices connected in the electricity grid to the supply electricity grid device; determine a phase of at least one demand electricity grid device in the set of demand electricity grid devices via comparing, over a series of time intervals, a total power consumed from the supply electricity grid device with power consumed by the set of demand electricity grid devices; and output a determined phase for at least one demand electricity grid device in the set of demand electricity grid devices.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

BRIEF DESCRIPTION OF THE SEVERAL VIEWS OF THE DRAWINGS

FIG. 3 illustrates example power consumption measurements for determining phase.

DETAILED DESCRIPTION

Figure 1:
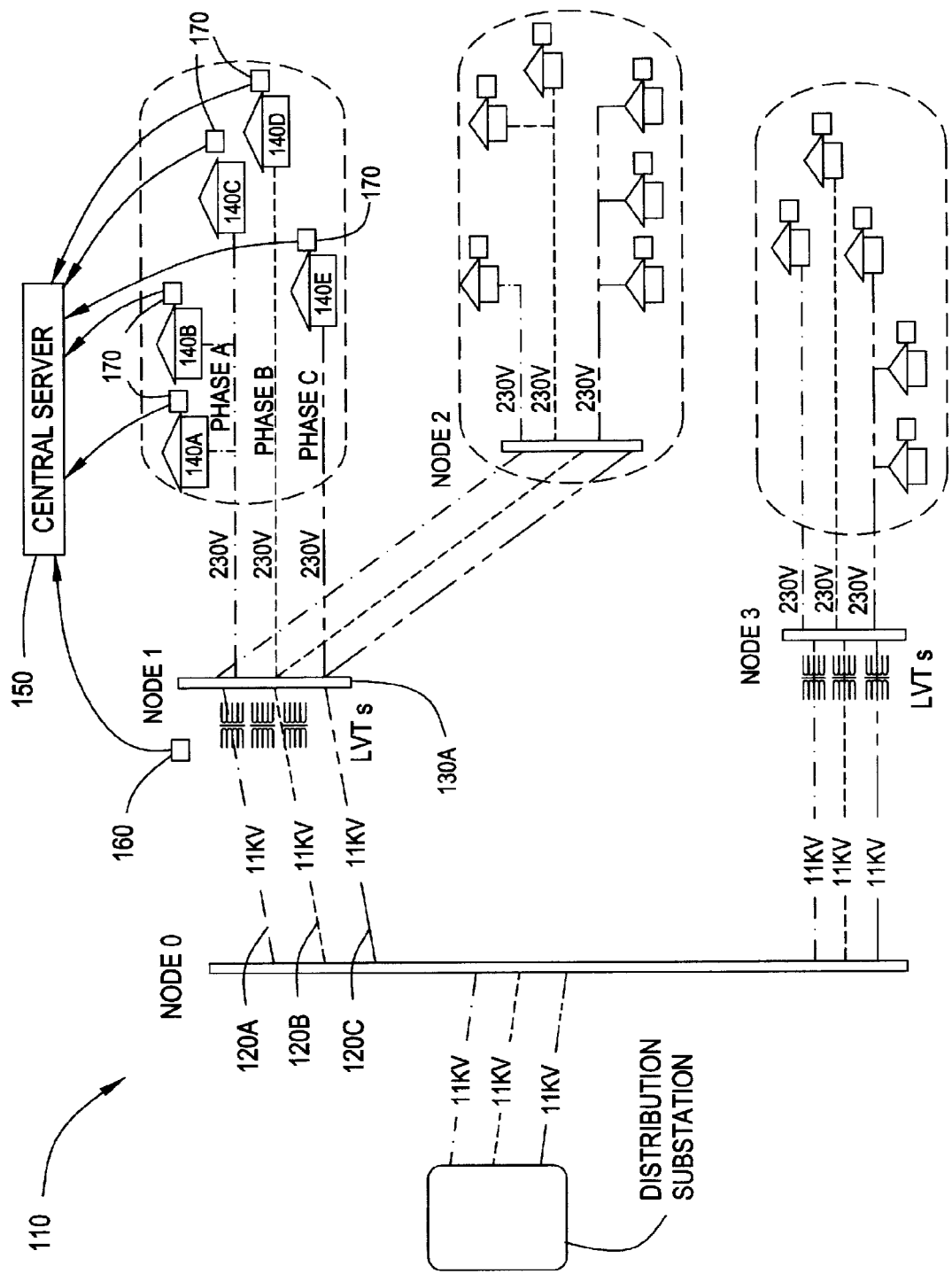
FIG. 1 illustrates an example electricity grid and electricity grid devices.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the claims, but is merely representative of those embodiments.

Reference throughout this specification to "embodiment(s)" (or the like) means that a particular feature, structure, or characteristic described in connection with the embodiment is included in at least one embodiment. Thus, appearances of the phrases "according to embodiments" or "an embodiment" (or the like) in various places throughout this specification are not necessarily all referring to the same embodiment.

Furthermore, the described features, structures, or characteristics may be combined in any suitable manner in at least one embodiment. In the following description, numerous specific details are provided to give a thorough understanding of example embodiments. One skilled in the relevant art will recognize, however, that aspects can be practiced without certain of the specific details, or with other methods, components, materials, et cetera. In other instances, well-known structures, materials, or operations are not shown or described in detail to avoid obfuscation.

Electricity grids provide power via a network. Transmission networks currently carry power in three phases, A, B and C. Usually, households get a single-phase power supply by being connected to one of the three phases. The three phases must be balanced for distribution grids to be efficient. For example, unbalanced phases increase energy losses, increase the risk of overload, increase the risk of overheating, and additionally shorten the life span of costly grid components such as transformers. Moreover, unbalanced phases affect power quality and electricity prices for consumers.

The phases go out of balance either because unequal numbers of households are connected to them and/or the consumption profiles of those households are unequal. The first step in balancing the phases is phase identification. Phase identification, or determination, includes accurately identifying the set of households connected to each of the phases. Conventional mechanisms for phase identification require either manual intervention or expensive new instrumentation beyond smart meters.

In contrast, embodiments provide a tomography-based approach to compute phase. Household phase determination is utilized herein as a non-limiting example; however, phase determination may be accomplished in other portions of an electricity grid using the same principles. An embodiment employs an approach based on mathematical programming techniques that analyze a time series of power measurements recorded by smart meters at households (demand points) and at transformers (supply points). The mathematical formulations for phase identification are presented and described herein. Embodiments can implement these formulations using mixed integer programming (MIP) solvers. Given enough measurements and if the errors are small, embodiments can also implement relaxations of problems using continuous linear and quadratic programming solvers to determine phase efficiently. In an APPENDIX attached hereto, example experimental results using a combination of synthetic and real smart data (measurements) are presented that demonstrate the performance of relaxations and statistical techniques, as implemented by the embodiments described herein.

The description now turns to the figures. The illustrated example embodiments will be best understood by reference to the figures. The following description is intended only by way of example and simply illustrates certain example embodiments representative of the invention, as claimed.

Referring to FIG. 1, in a three-phase network (electricity grid) 110, three feeders (120A, 120B, and 120C) carry three alternating (11 kV) currents (of the same frequency) which reach their instantaneous peak values at different times. To be efficient, these phases should be balanced, such that the magnitudes of current and voltage are equal for all three phases. Further motivation for phase identification is to facilitate introduction of distributed energy generation at the households. The excess energy generated at the households can be injected back into the network over one of the three phases. Therefore, phase identification is important for balanced infusion of energy into the grid. The reasoning for balancing this energy generation is similar to the distribution of energy in the other direction, from the grid to the households.

It is important to note that phases should be balanced all the way from the substation to the households. For example, in FIG. 1, phases A, B and C should be balanced all the way from Node 0 to the Low Voltage Transformers (LVTs) at the street pole 130A. This involves phase identification for the electrical loads 140A-E (households in the example illustrated in FIG. 1) that are powered by each of the phases. While the utilities usually have accurate information about the topology and the loads at the core of the grid, they rarely have up-to-date information about the customer edge of the network. Sometimes the mapping between customers and phases may be known initially; however, accuracy of even this partial information deteriorates over time due to maintenance and repairs.

A conventional approach to phase identification requires manual measurement of phase angles using phase angle meters. However, this approach is expensive because it involves sending crews to customer premises. More significantly, this process may need to be repeated after every maintenance and repair procedure. Other proposed approaches include deploying a Phasor Measurement Unit (PMU) in each household, signal injection methods, and interpreting outage data. However, none of these methods are practical as they are expensive and/or require special equipment. A single PMU costs about $10,000, and signal injection methods require communication over power lines, in addition to assets at transformers and meters, which are expensive. A disadvantage of relying on outage data is that many locations, especially in developed countries, experience very few outages.

In contrast, an embodiment employs a tomography approach that takes advantage of the recent drive for digitization of electricity grids around the world. Specifically, an embodiment utilizes a system of linear equations based upon the principle of conservation of electric charge. As applied in the example cases discussed herein, conservation of electric charge can be restated as: energy supplied by a feeder (to a supply device such as a LVT) must be equal to the energy consumed by all the households (demand devices) connected to that feeder, and feeder line losses.

An embodiment utilizes these equations to determine a unique set of houses that are connected to a phase by using a series of approximately time-synchronized measurements collected by transformer and household meters. As illustrated in FIG. 1, measurements collected from a transformer device 160 associated with a LVT transformer and household smart meters (for example, 170) are transported to a central server 150 that executes phase determination calculations.

The term tomography is used because a specific inverse problem in the smart grid context is being dealt with. The problem of phase identification involves a linear inverse problem $b = Ax + \epsilon$ with b, A known, x, $\epsilon$ unknown, and x binary.

The errors arise due to imperfect synchronization of measurements at homes and transformers, and unknown and time-varying line-loss conditions.

Phase Identification Problem

Figure 2:
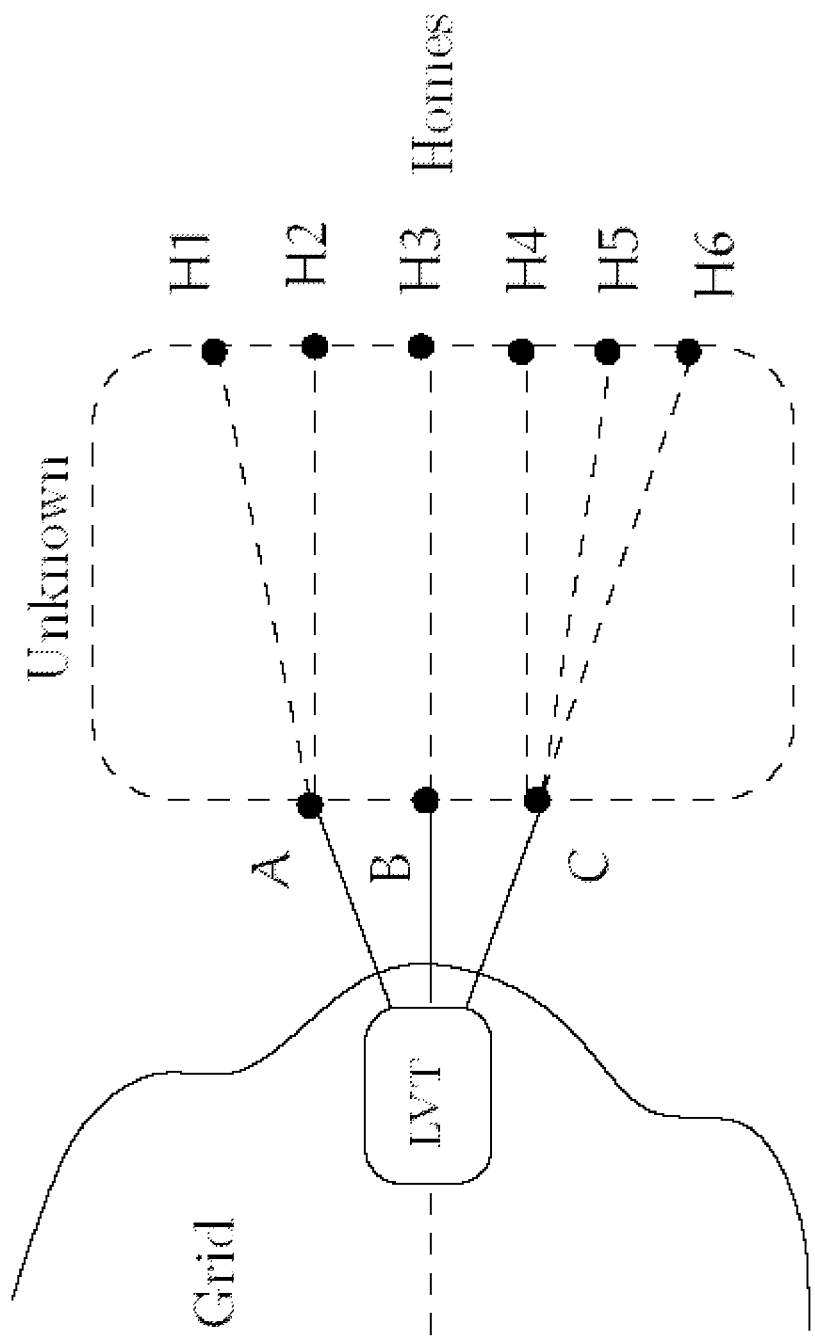
FIG. 2 illustrates an example of the problem of household phase determination.

FIG. 2 shows a simple example of the phase identification problem with 6 homes (H1-6). A LVT at the edge of the grid powers 6 homes (H1-6) on a street with each home connected to one of the three phases A, B, or C. It is not known which home is connected to which phase. For example, the underlying connectivity that is to be determined is shown in dotted lines: {H1, H2} are connected to phase A, H3 to phase B, and {H4, H5, H6} to phase C.

An embodiment determines phase using a time series of synchronized measurements derived from homes and the LVT. With utilities making the transition to smart grids and deploying advanced metering infrastructure, periodic measurements of power consumption are available from both homes and transformers. The principle of conservation of electric charge implies that during any time interval, the total load on a phase equals the sum of demands of customer households on that phase. Since these demands vary with time and across different households, customer phases can in fact be recovered by analyzing home and transformer load measurements over several time steps.

FIG. 3 shows an example time series of power measurements taken from homes and the LVT transformer over intervals of 10 minutes each. For instance, the first row shows that during the first 10 minutes home H1 consumed a total of 2 watt-hours (Wh) and the total power consumed at phase A is 5.5 Wh. The problem is to determine the phase of each home from such measurements. Now observe that, at each time step, loads of homes H1 and H2 sum up to the load on phase A (columns H1 and H2 sum up to column A). Similarly, column H3 is same as column B, and columns H4, H5, and H6 sum up to column C. From this it can be inferred that homes {H1, H2} must have been connected to Phase A, {H3} to B, and {H4, H5, H6} to C.

In the above example, at each time step, the total load on a phase is exactly equal to the sum of loads of homes connected to that phase. In practice, however, due to line losses, synchronization errors, and other types of errors, at each time step the load measurement at a phase is only approximately equal to the sum of load measurements of homes connected to that phase.

Measurement Setup and Errors

Consumer smart meters can record and report periodic measurements of power consumed in watt-hours (Wh) over small time intervals, such as 15 minutes or half an hour, as setup by the utility. For example, if a home had a 300-watt refrigerator switched on (with its compressor running) for a duration of 15 minutes (¼ hour), such a meter would report about 300*¼=75 Wh.

Government regulations require that the watt-hours reported by consumer meters be accurate, typically of the order of 99.5% accuracy. Since a meter records readings based on its internal clock, this clock may be out of synch with respect to the true clock. If a consumer meter reports that 75 Wh were consumed from 10:00:00-10:15:00 AM and its clock lags the true clock by 1 sec, in reality the 75 Wh were actually consumed between 10:00:01-10:15:01 AM. Therefore, even if all consumer meters are setup to report over the same time intervals, each may suffer from a different clock drift and report Wh consumed over a slightly different time interval.

Meters deployed at transformers are much more complex devices than consumer meters. Unlike consumer meters, meters deployed at transformers measure several fine-grained parameters needed to monitor a transformer, such as voltage, current, power factor, parameters for fault analysis, power down time, under/over load, load balance, et cetera. Different manufacturers use different monitoring technologies, and parameters published may vary. Nevertheless, the basic parameters needed to compute the total power consumed on each phase of the transformer during a time interval are available. The real power consumed at a phase can be computed using voltage, current, and power factor measurements. In AC circuits, real power is the product of power factor and apparent power; apparent power is the product of rms voltage and rms current. However, meters publish average values of these parameters over small time intervals, and therefore the watt-hours computed for each phase during a time interval are estimates of the actual watt-hours consumed and may contain some errors. Similar to a consumer meter, clock synchronization problems may also occur at the transformer meter.

As previously noted, due to laws of conservation, during any time interval the Wh measured at homes connected to a common phase must sum up to the Wh measured at the same phase in the transformer. However due to the measurement errors, briefly outlined above, the summation may be approximate. There are also other factors that can cause the summation to be approximate. First, there may be line losses (since power lines possess a certain amount of electrical resistance, some of the transferred energy is lost as heat) on power lines connecting transformer phases to homes. It is worth noting that line loss varies with ambient temperature, load, age of the feeder, et cetera. Second, there can be power connections that are un-metered or with no available metering information, such as street lights connected to the transformer, which consume power during the night.

Example Phase Identification Technique

The phase identification problem may be modeled as follows. Let m be the number of measurements taken over time and let n be the number of homes. Let $C=\{1, \ldots, n\}$ be the set of indices for customer homes, $J=\{1, 2, 3\}$ be the set of indices for phases, and $K=\{1, \ldots m\}$ be the set of indices for measurements. Let $x_{ij}$ be an indicator variable which determines the connectivity of home i to phase j, that is:

$$x_{ij} = \begin{cases} 1 & \text{if home } i \text{ is connected to phase } j \\ 0 & \text{otherwise} \end{cases} \quad (1)$$

where $i \in C$ and $j \in f$. Since each home is connected to exactly one of the three phases, it follows that:

$$\sum_{j=1}^{3} x_{ij} = 1 \forall i \in C \quad (2)$$

Let $h_{ki}$ denote the (possibly erroneous) measurement at home i in the kth time step. Let $p_{kj}$ denote the (possibly erroneous) measurement at phase j at the kth time step. Then result is the following relationship:

$$\sum_{i=1}^{n} h_{ki} \times x_{ij} + e_{kj} = p_{kj} \quad (3)$$

$$\forall k \in k \forall j \in J$$

where $e_{kj} \in \mathbb{R}$ is the error in the kth measurement corresponding to summation for phase j. $e_{kj}$ compensates for the difference between the sum of home measurements and their phase measurement which arises due to line loss, synchronization errors, and other factors. Note that the model allows errors to vary across measurements.

Using the following matrix form to express equations (2) and (3), let $H=[h_{ki}]m \times n$ be the matrix of home measurements, $X_j=[x_{1j}, \ldots x_{nj}]^T$, $P_j=[p_{1j}, \ldots p_{mj}]^T$, and $e_j=[e_{1j}, \ldots, e_{mj}]^T$. M, X, P and E are defined as follows.

$$M = \begin{bmatrix} H & 0 & 0 \\ 0 & H & 0 \\ 0 & H & 0 \end{bmatrix} \quad (4)$$

$$X = \begin{bmatrix} X_1 \\ X_2 \\ X_3 \end{bmatrix}$$

$$P = \begin{bmatrix} P_1 \\ P_2 \\ P_3 \end{bmatrix}$$

$$E = \begin{bmatrix} e_1 \\ e_2 \\ e_3 \end{bmatrix}$$

Let $D_3=[I_n I_n I_n]$ where $I_n$ is an n×n identity matrix. Let $1_n$ denote an n×1 vector of all 1's. Then equations (2) and (3) respectively give:

$$D_3 X = 1_n \quad (5)$$

$$MX + E = P \quad (6)$$

The problem of phase identification is to determine the unknown binary vector $X \in \{0,1\}^{3n}$ given H, P and unknown E. Examples will now be described discussing different variants of the above problem, with and without errors, and examples are show as to how they can be solved.

First described are cases when there are no errors in measurements and the loads on phases exactly match the sum of loads of respective homes. Thus the $h_{ki}$'s and $p_{kj}$'s are non-erroneous and $e_{kj}$'s are zero.

Algorithmic Approach

The algorithmic approach is based on a combinatorial search and the simplest option is to use a brute force search over all possible solutions. However this can be computationally intensive. A more efficient approach is to use a dynamic program by converting the meter readings from homes and transformers into integers and regarding the phase identification problem as a variant of sum of subsets problem.

For the case of a single measurement, given the Wh for each of the three phases, finding three disjoint subsets of homes, such that the Wh of homes within each subset sum up to the Wh of a different phase, is of interest. This is a variant of sum of subsets problem and can be solved using a dynamic program that requires pseudopolynomial time. However, one measurement may not yield a unique solution. Given multiple measurements, solutions that satisfy all measurements are desired. Therefore, a dynamic programming table is constructed for each measurement and solutions that satisfy all tables are extracted. As the number of measurements increase, the search space narrows and a unique solution may be found.

Mathematical Approach

In the mathematical approach, when a time series of measurements is obtained, the equations (5) and (6) can be combined as follows.

$$A = \begin{bmatrix} M \\ D_3 \end{bmatrix} \quad (7)$$

$$B = \begin{bmatrix} P \\ 1_n \end{bmatrix}$$

Thus, the following system of constrained linear equations:

$$AX=B$$

$$x_{ij} \in \{0,1\}, \forall i \in C, \forall j \in J \quad (8)$$

Since the above system has binary constraints on the unknown X, it cannot be solved using linear algebra. Equation (8) is in fact a 0-1 integer linear program (ILP) (with zero objective function) and can be solved using an MIP solver. However this may take exponential time for some problem instances as solving an ILP is NP-hard. Alternately, the following relaxations can be used to retrieve the unique solution of equation (8) in polynomial time provided sufficient measurements are available.

Linear Systems Relaxation $$AX=B$$

$$x_{ij} \in \mathbb{R}, \forall i \in C, \forall j \in J \quad (9)$$

Equation (9) is an unconstrained relaxation of equation (8) wherein the integrality constraints on X have been dropped. It can be solved using linear algebra provided A has full rank. When this holds, the relaxation equation (9) and the ILP equation (8) both yield the same unique binary solution. This is because the ground truth that yields these measurements is in fact binary and the full rank condition implies that the system has a unique solution.

The matrix A has 2m+n independent rows. This can be seen by observing that any solution that satisfies the first 2m, and the last n equations always satisfies equations 2m+1 ... 3m, simply because it suffices to find homes that are connected to phase 1 and 2, the balance would have to be connected to phase 3. Therefore these equations are not linearly independent and rank(A)=min(3n, 2m+n). This implies that when m=n, A has full rank and therefore phases of all homes can be recovered simply by solving a system of linear equations.

Linear Programming Relaxation

In order to obtain an LP relaxation of equation (8), the binary variables from $\{0,1\}$ to $\{-1,1\}$ are first transformed using the following transformation:

$$Y = 2X - 1_{3n}$$

Note that $X \in \{0,1\}^{3n} \Leftrightarrow Y \in \{-1,1\}^{3n}$. Therefore, the following ILP is equivalent to equation (8):

$$AY = 2B - A1_{3n}, Y \in \{-1,1\}^{3n} \quad (10)$$

To solve the above, the following LP relaxation is used:

(LP1)

$$\text{Min} \|Y\|_1 \quad (11)$$
$$\text{s.t. } AY = 2B - A1_{3n}$$
$$Y \in [-1, 1]^{3n}$$

The following lemma relates equation (10) to equation (11). The phrase "integer solution" will be used herein to mean a solution in which each element belongs to the set $\{-1,1\}$ and the phrase a "fractional solution" to mean a solution in which all elements belongs to the closed interval $[-1,1]$ and there exists at least one element that belongs to open interval $(-1,1)$. The objective function of LP1 is non-linear due to the presence of L1 norm, but it can be made linear, as described herein.

LEMMA 1. If equation (11) returns an integer solution, that solution is the unique integer solution of both equation (11) and equation (10).

PROOF. Note that every solution to equation (10) satisfies the equality constraints of equation (11) and any integer solution returned by equation (11) is a solution of equation (10). For any integer solution Y, $\|Y\|_1=3n$. For any fractional solution Y, $\|Y\|_1<3n$. Now since $[-1,1]^{3n} \supset \{-1,1\}^{3n}$, a solution that is unique to equation (11) and is integer is also unique to equation (10).

When m=n, from the discussion on linear systems relaxation herein, A has full rank and therefore both equation (11) and equation (10) will yield the same unique integer solution.

When m<n, equation (10) may have multiple integer solutions. For the sake of contradiction, assume that equation (11) returns an integer solution $Y_1$ when in fact equation (10) has multiple solutions, say $Y_1, Y_2$. Since $Y_1, Y_2$ satisfy constraints of equation (11), there exists a fractional solution $Y=\alpha Y_1 + (1-\alpha)Y_2$, $\alpha \in (0,1)$ that also satisfies these constraints. However since Y is a fractional solution, $\|Y\|_1 < \|Y_1\|_1$ and therefore equation (11) could not have returned $Y_1$.

It is possible that equation (11) returns a fractional solution even if equation (10) has a unique integer solution. However, in previous works, it has been show that when a system of linear equations with integer solutions of the form Fs=d, $F \in IR^{r \times c}$, $s \in \{-1,1\}^c$, the probability that its LP relaxation $\text{Min} 0^T s$ s.t. Fs=d, $F \in IR^{r \times c}$, $s \in [-1,1]^c$ returns a unique integer solution is high. In particular for random matrices F, when $r/c > \frac{1}{2}$, this probability rapidly approaches 1 and for $r \ll c/2$ it rapidly approaches 0.

For the problem discussed herein, there are three related systems $HX_j=P_j$ with $\Sigma_j X_j=1_n$, $j \in J$ where H is an m×n matrix, and therefore the problem has more constraints. As discussed further herein, using experiments that for random matrices H, when homes are evenly assigned to the three phases, the probability that equation (11) yields a unique integer solution begins to approach 1 even before m/n reaches ½. However in the worst case when homes are assigned unevenly, this occurs when $m/n > \frac{1}{2}$.

Solution Space

Figure 4:
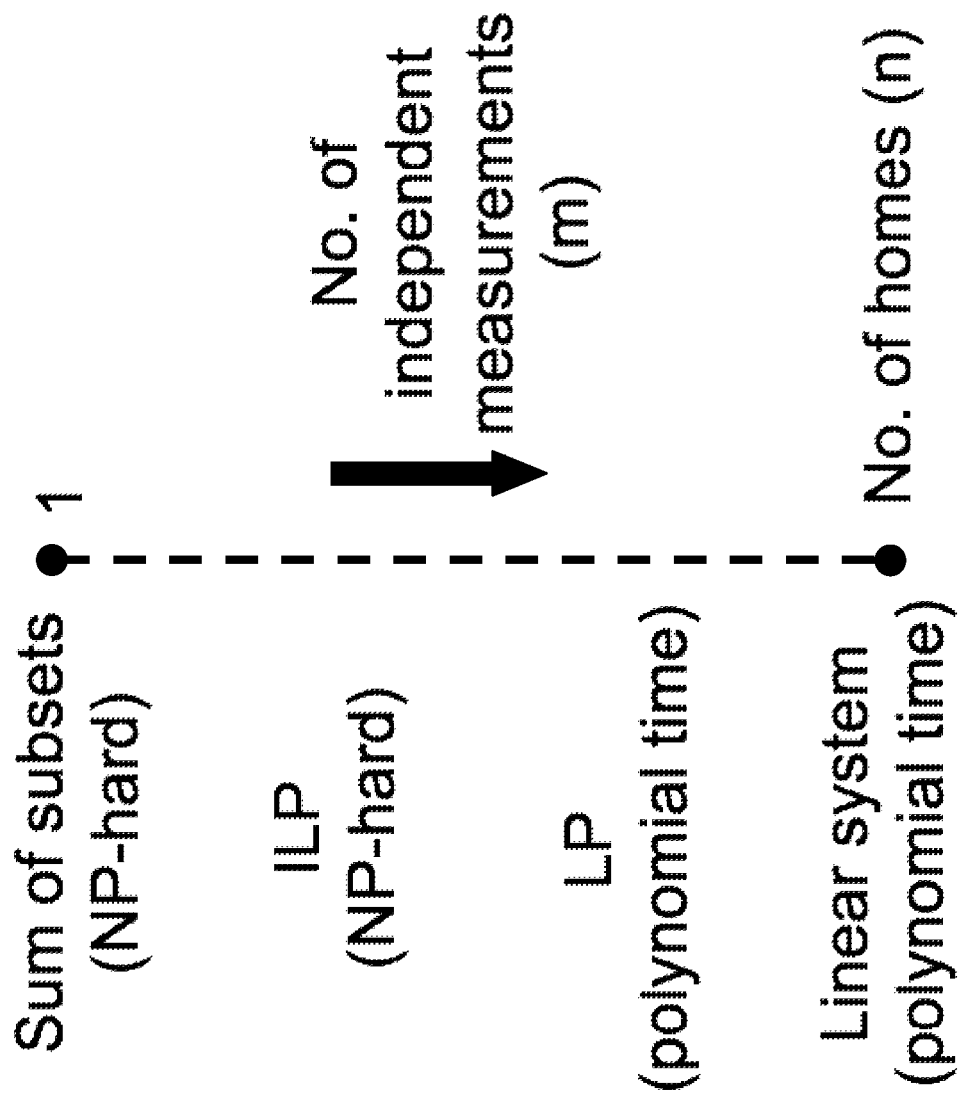
FIG. 4 illustrates the solution space for a no errors case.

FIG. 4 shows the solution space for the no errors case. When there is just one measurement, the problem reduces to a variant of sum of subsets problem. When the number of measurements (constraints) increase but are still less than about half the number of homes, one could use either the algorithmic approach or use an MIP solver to solve the integer linear program equation (8). When the number of measurements exceed n/2, it is highly likely that one can use the LP relaxation equation (11) to obtain an integer solution and this only requires polynomial time. When m=n, the solution can be retrieved simply by solving a system of linear equations (9).

Constant Errors Case

The cases where errors on each phase are either constant across measurements or a fixed fraction of the load on that phase during each time interval are now considered. Such errors essentially model losses occurring on power lines that connect homes to phases.

Thus, as before $h_{ki}$'s and $p_{kj}$'s are non-erroneous but $e_{kj} \propto p_{kj}$, that is, the error is proportional to the phase load at each time step. Let $e_{kj}=f_j p_{kj}$. Here, $f_j$ is a fraction that is fixed for each phase and $f_j p_{kj}$ denotes the total line loss that occurs in the k th time step on lines that connect homes to phase j.

$$\sum_{i=1}^{n} h_{ki} x_{ij} + p_{ki} f_j = p_{kj} \quad (12)$$

$$\forall k \in K \forall j \in J$$

This problem can be modeled in the same manner as the no errors case with a few additional variables. Let. Let $X'_j = [X_j^T f_j]^T$. Let $H'_j = [HP_j]$ and $I' = [I_n 0_{n \times 1}]$. Defining A', X' as follows, and P and B as before:

$$A' = \begin{bmatrix} H' & 0 & 0 \\ 0 & H' & 0 \\ 0 & 0 & H' \\ I' & I' & I' \end{bmatrix} \quad (13)$$

$$X' = \begin{bmatrix} X'_1 \\ X'_2 \\ X'_3 \end{bmatrix}$$

Then one has the following mixed integer linear program:

$$x_{ij} \in \{0,1\}, 0 \leq f_j \leq 1, \forall_j \in C, j \in J \quad (14)$$

As before, one can solve the following linear systems relaxation instead $$A'X'=B, X' \in IR^{3n+3} \quad (15)$$

However, m=n+1 for A' to have full rank in order to recover phases of homes and the errors.

Variable Errors Case

This is the most general setting wherein errors can vary across measurements due to loss of synchronization, time varying line losses, and other factors discussed herein. Two approaches to solving equations (5) and (6) are considered that minimize different norms of the error vector E.

Min $L_2$ norm: Quadratic programming (QP)

In this case, the goal is to find a binary solution X that minimizes the $L_2$ norm of the error vector E, that is:

$$\min_x \|B - AX\|_2^2 \quad (16)$$

(Quadratic function)

s.t. $D_3 X = 1_n$ (Linear constraints)

$x_{ij} \in \{0, 1\}, \forall i \in C, \forall j \in J$ (Binary Constraints)

Equation (16) is a 0–1 quadratic program or a quadratic pseudoboolean minimization problem and can be solved using an MIP solver. The goal is to choose a binary vector from the set $\{X \in \{0,1\}^{3n} | D_3 X = 1_n\}$ which minimizes the real-valued quadratic function $\|P-MX\|_2^2$.

Two strategies that can help solve equation (16) efficiently include: (a) Continuous relaxation plus rounding, and (b) Linearization.

Continuous Relaxation

The most easily solvable continuous relaxation is the unconstrained least squares relaxation which is as follows:

(QP1)

$$\operatorname*{Min}_{x}\|B - AX\|_2^2, \, x_{ij} \in IR \, \forall \, i \in C, \, \forall \, j \in J \quad (17)$$

$$A = \begin{bmatrix} M \\ \lambda \cdot D_3 \end{bmatrix}, B = \begin{bmatrix} P \\ \lambda \cdot 1_n \end{bmatrix}$$

where the parameter $\lambda > 1$ adds additional weight to the equality constraints $D_3 X = 1_n$ so that chances of obtaining solutions that satisfy these are maximized. Equation (17) has a unique solution when A has full rank, that is when $m \geq n$, and the solution can be written explicitly using normal equations as $X_{(\lambda)} = (A^T A)^{-1}(A^T B)$. Given a solution, a check is made if (i) linear equality constraints are satisfied and (ii), $\forall x_{ij}, 0 \leq x_{ij} \leq 1$. If so, embodiments proceed to round the solution.

Other than equation (17), one can also use a constrained least squares relaxation in which only the binary constraints in equation (16) are replaced by continuous constraints $X \in [0, 1]^{3n}$. This relaxation is termed (QP2). Constrained least squares is a well studied problem and a number of efficient methods are available to retrieve a fractional solution of equation (16), and thus will not be explained further herein.

Given a fractional solution, it is rounded as follows. Let $j_1$ be such that $X_{ij_1} = \max_{j \in J} \{x_{ij}\}$, setting $X_{ij} = 1$ for $j = j_1$ and $X_{ij} = 0 \, \forall j \neq j_1$. This is repeated $\forall i \in C$. Thus, the rounded solution satisfies the linear equality constraints.

Unlike relaxation directly yielding integer solutions, here integer solutions are obtained by rounding. Therefore, it is not possible to determine if an optimal integer solution has been obtained. One approach to deal with this is to accept an integer solution X only if its error is comparable with the error of the fractional solution $X^*$, that is, $\|P - MX\|_2 \leq (1 + \epsilon)\|P - MX^*\|_2$, $\epsilon > 0$.

Example experiments to determine the number of measurements needed for rounded solutions of continuous relaxations above to yield optimal solutions are included in the APPENDIX.

Linearization

Linearization is an approach of converting 0–1 quadratic programs to 0–1 integer linear programs. This comes at a cost of increase in the number of variables and constraints. The objective function in equation (16) can be expanded as follows:

$$\operatorname*{Min}_{x} \sum_{j \in J} \{P_j^T P_j - 2 < H^T P_j, X_j > + X_j^T Q X_j\}$$

where $<*,*>$ denotes a dot product and $Q = [q_{ih}]_{n \times n} = H^T H$. The above objective function may be linearized as follows. $x_{ij}^2$ can be replaced by $x_{ij}$ since squaring a binary variable leaves it unchanged. The product of two binary variables $x_{ij} x_{hj}$ can be represented by a continuous variable $w_{ihj}$ using these constraints: $w_{ihj} \leq x_{ij}, w_{ihj} \leq x_{hj}, w_{ihj} \geq x_{ij} + x_{hj} - 1, w_{ihj} \geq 0$. However, since there is a minimization function and $q_{ij} \geq 0 \, \forall i, j$ the first two constraints are not required. Applying these changes gives the following mixed integer linear program:

$$\operatorname*{Min}_{X,W} \sum_{j \in J} \left\{ P_j^T P_j - 2 < H^T P_j X_j > + 2 \sum_{i < h, i, h \in C} q_{ih} w_{ihj} + \sum_{i \in C} q_{ii} x_{ij} \right\} \quad (18)$$

s.t. $D_3 X = 1_n$ $w_{ihj} \geq x_{ij} + x_{hj} - 1 \, \forall \, j \in J, \, \forall \, i, h \in C, \, i < h$ $x_{ij} \in \{0, 1\} \, \forall \, i \in C, \, \forall \, j \in J$ $w_{ihj} \geq 0 \, \forall \, i, h \in C, \, i < h, \, \forall \, j \in J$ This leads to a quadratic increase in the number of variables and constraints. In addition to the original 3n binary variables, there are $3(n^2 - n)/2$ new continuous variables giving a total of $3(n^2 + n)/2$. In previous work, RLT constraints were proposed that involve multiplying original constraints by the binary variables. For the phase determination problem, these add more variables that do not appear in the objective function and hence are not used.

Another approach proposed in previous works, which leads to a linear increase in the number of variables, is as follows. For each $x_{ij}$, two new continuous variables $s_{ij}$ and $y_{ij}$ are defined. Similarly, defined are $Sj + [s_{1j}, \ldots, s_{nj}]^T$ and $Yj + [y_{1j}, \ldots, y_{nj}]^T$. Equation (16) is equivalent to the following mixed integer program:

$$\operatorname*{Min}_{X,S,Y} \sum_{j \in J} \{P_j^T P_j - 2 < H^T P_j X_j > + 1_n^T S_j\} \quad (19)$$

s.t. $D_3 X = 1_n$ $Q X_j = S_j + Y_j \, \forall \, j \in J$ $y_{ij} \leq y_i (1 - x_{ij}) \, \forall \, i \in C, \, j \in J$ $x_{ij} \in \{0, 1\}, \, s_{ij} \geq 0, \, y_{ij} \geq 0 \, \forall \, i \in C, \, j \in J$ where $y_i$ is the sum of elements in the ith row of Q. The above formulation adds 6n new continuous variables resulting in a total of 9n variables.

Min $L_1$ norm: Linear programming (LP)

The goal here is to find a binary solution X that minimizes the $L_1$ norm of the error vector E, that is:

$$\operatorname*{Min}_{x} \|P - MX\|_1 \quad (20)$$

s.t. $D_3 X = 1_{n \times 1}$ $x_{ij} \in \{0, 1\}, \, \forall \, i \in C, \, \forall \, j \in J$ Although the minimization function is non-linear due to the presence of $L_1$ norm, equation (20) can be made linear as follows. Introducing 3m additional variables $V = [v_1, \ldots, v_{3m}]^T$, one has the following mixed integer linear program:

$$\operatorname*{Min}_{V,X} 1_{3m}^T V \quad (21)$$

s.t. $-V \leq P - MX \leq V$ $D_3 X = 1_{n \times 1}$ $x_{ij} \in \{0, 1\}, \, \forall \, i \in C, \, \forall \, j \in J$ $v_l \geq 0 \, \forall \, l \in \{1, \ldots, 3m\}$ Equation (21) is a mixed integer linear program and is NP-hard.

Multiple Solutions

Equation (16) and (20) may have multiple optimal solutions. Besides, as the variance of error increases, both equations (16) and (20) may yield optimal solutions that have a lower objective function value than that of the true underlying solution. Therefore, finding one optimal solution may not be sufficient and it may be required to find multiple optimal solutions and non-optimal solutions that lie in the vicinity of the optimal solution.

Let g(X) denote the objective function for $L_2$ or $L_1$ norm minimization and let X* be an optimal solution. Then, the goal is to find all solutions X with a relative optimality gap of $\alpha$, where $\alpha = |\{g(X)-g(X^*)\}/g(X)|$. $\alpha$ is usually close to 0, for example 5%.

One approach to retrieve multiple solutions is to solve for one solution and then successively re-solve by excluding previously obtained solutions. The following constraint, also called as a binary cut, can be added to equations (16) and (20) to exclude an existing binary solution $X' \in \{0,1\}^{3n}$:

$$\sum_{(i,j) \in G} x_{ij} - \sum_{(i,j) \notin G} x_{ij} |G| - 1, \; G = \{(i,j) \mid x'_{ij} = 1\} \quad (22)$$

The above constraint ensures that the new solution has at least one $x_{ij} \neq x'_{ij}$.

Given multiple solutions, for each home, embodiments can output the fraction of solutions that assign it each phase. As the number of measurements increases, the occurrence of multiple optimal solutions as well as occurrence of optimal solutions with error lower than the true solution will decrease.

Statistical Correlation

Embodiments exploit the correlation between home and phase measurements to determine phases of homes. Let $H_i\{h_{i1}, \ldots, h_{im}\}$ denote the time series of load measurements from the ith home, $i \in C$. Similarly let $P_j\{p_{j1}, \ldots, p_{jm}\}$ denote the time series of load measurements from the jth phase, $j \in J$. Let C(j) denote the set of homes assigned to phase j.

If $i \in C(j)$, then its is highly likely that $H_i$ and $P_j$ are positively correlated. To see why, assume that all homes $\in C(j)$ except i have constant measurements over time. Then any increase or decrease in $H_i$ leads to a resulting increase or decrease in $P_j$. In general, since $P_j = e_j + \Sigma_{i \in C(j)} H_i$, each home's measurement has a small contribution to the increase or decrease of $P_j$. Furthermore for any non-empty subset $C' \subseteq C(j)$, the summation $\Sigma_{i \in C'} H_i$ is positively correlated to $P_j$. It is likely that the correlation becomes stronger as $C' \to C(j)$. When $C' = C(j)$, maximum correlation is obtained, and perfect correlation is obtained when $e_j=0$.

In order to test if $H_i$ and $P_j$ are correlated, Pearson's product moment correlation coefficient may be utilized:

$$\rho_{ij} = \frac{\text{Cov}(H_i P_j)}{\sigma_{H_i} \sigma_{P_j}} \quad (23)$$

The correlation coefficient $\rho \in [-1,1]$ has an associated statistic $t=\rho\sqrt{(m-2)}/\sqrt{1-\rho^2}$ that follows the student t-distribution and can be used to test the null hypothesis of no correlation. For example, if the p-value<0.01, one can reject the null hypothesis that $H_i$ and $P_j$ are uncorrelated with 99% confidence. The above statistic has normality assumptions; however, when the sample sizes are large, it can be used even with non-normal data.

An embodiment may use correlations to determine a phase identification solution using a two step refinement algorithm, as follows. In the first step, an embodiment computes $\rho_{ij} \forall i \in C$, $j \in J$. For each home $i \in C$, the phase is determined with which it is maximally correlated and assign it that phase. This results in 3 sets of homes. In the next step, potential false assignments are corrected as follows. For each set, if after removing a home, the correlation of the set with its phase increases, an embodiment excludes the home from that set. The excluded home is then assigned to one of the other two sets depending on its contribution in increasing the correlation of those sets.

In addition, the p-value of correlation coefficient can be used to associate confidence with a solution obtained through LP/QP relaxations. This is useful when fractional solutions are rounded to integer solutions and its not known if the true solution was reached.

Thus, embodiments have been presented which utilize a tomography-based approach for phase identification in smart distribution grids. For example, the measurements from smart meters at homes and transformer meters are collected into a linear system of equations; and an inverse solution is desired. Embodiments employ a collection of mathematical formulations for phase identification, where no-error and low to medium error cases tend to be efficiently solvable with limited number of measurements. A set of relaxations (LP and QP) and statistical approaches are provided, and their behavior as a function of different types or errors are indicated in the APPENDIX. Unless synchronization errors are high, embodiments can simply use QP relaxations to retrieve the true underlying phase assignment or approximate solutions wherein a large number of homes are assigned the right phase.

Figure 5:
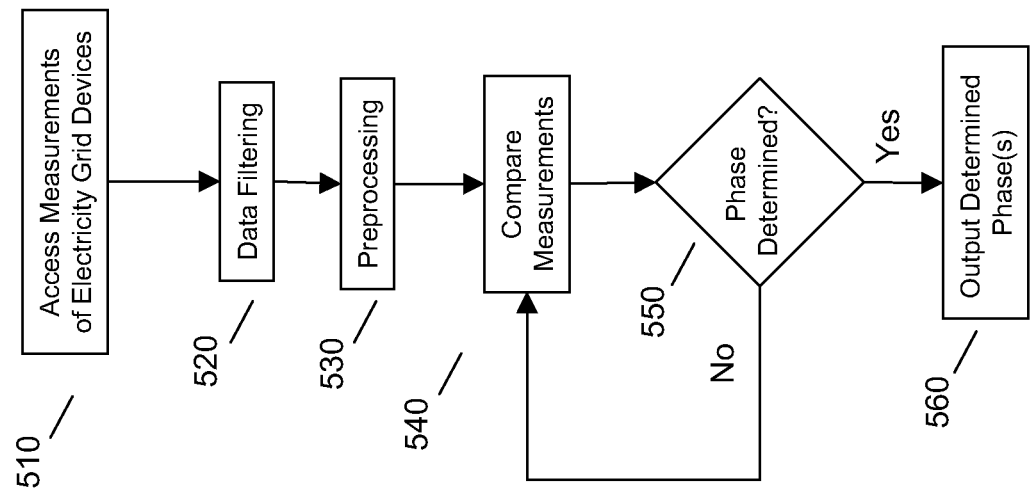
FIG. 5 illustrates an example method for determining phase.

Referring to FIG. 5, an example method for determining phase is illustrated. At 510, measurements are accessed in order to compare and determine phase. For example, power consumption measurements are accessed by a computing device, such as central server device 150 receiving power consumption measurements from metering devices 160, 170, of FIG. 1. The measurements include, for example, periodic synchronous measurements of voltage, current, and power for each phase of a LVT (supply electricity grid device), and elapsed kilowatt-hours at buildings (demand electricity grid devices). At 520 and 530, data filtering and/or preprocessing can be applied to the measurements in advance of comparing the measurements at 540 to determine phase. For example, data filtering may include at least one of filtering measurements based on the time of day, the day, and load error (for example, so as to take into account weather conditions), meter readings (such as dropping measurements representing identical and/or duplicate meter readings), or missing measurements (for example, when a home measurement is missing for a measurement interval). Preprocessing may include, for example, accumulation of meter readings in order to provide approximate synchronization in time with other meter readings.

In comparing the measurements to determine phase 540, embodiments may utilize at least one of a dynamic programming approach, a linear systems approach, a linear programming approach, a quadratic programming approach, a mixed integer linear programming approach, a mixed integer quadratic programming approach, or a correlation-based statistical approach in determining phase, as described herein. For example, when the number of measurement sets (such as house meter readings and transformer meter readings) is less than the number of house meters, embodiments may employ a dynamic programming approach to identify the set of houses whose readings sum up to the phase meter readings. As indicated at 550 in FIG. 5, this may be repeated until a phase is determined. As another example, when the number of measurement sets (such as house meter readings and transformer meter readings) is equal to the number of house meters and the measurements are known to contain either no errors or constant errors across measurements, embodiments may employ a linear systems approach to determine phase. If the number of measurement sets is (roughly) equal to or larger than the number of house meters and/or the measurements are known to contain errors that vary across measurement sets, embodiments may employ a linear programming/mixed integer linear programming approach, a quadratic programming/mixed integer quadratic programming approach, and/or statistical methods to determine phase.

In addition, embodiments may utilize the above methods when some of the measurements are missing, either from smart meters or transformer meters. For example, an embodiment that implements the correlation-based approach may filter out missing measurements and use the remaining set of measurements. An embodiment that implements one of continuous/integer linear/quadratic programming approaches may filter and/or replace missing measurements with zero and obtain a solution.

Once phase has been determined at 550, embodiments output determined phase(s) at 560. If the measurements are known to contain errors, embodiments may output multiple likely solutions (determined phases). An embodiment outputs a determined phase(s) at 560 such that a unique most likely solution of devices, such as buildings, having total meter readings closely matching the phase meter readings across multiple measurement sets.

Figure 6:
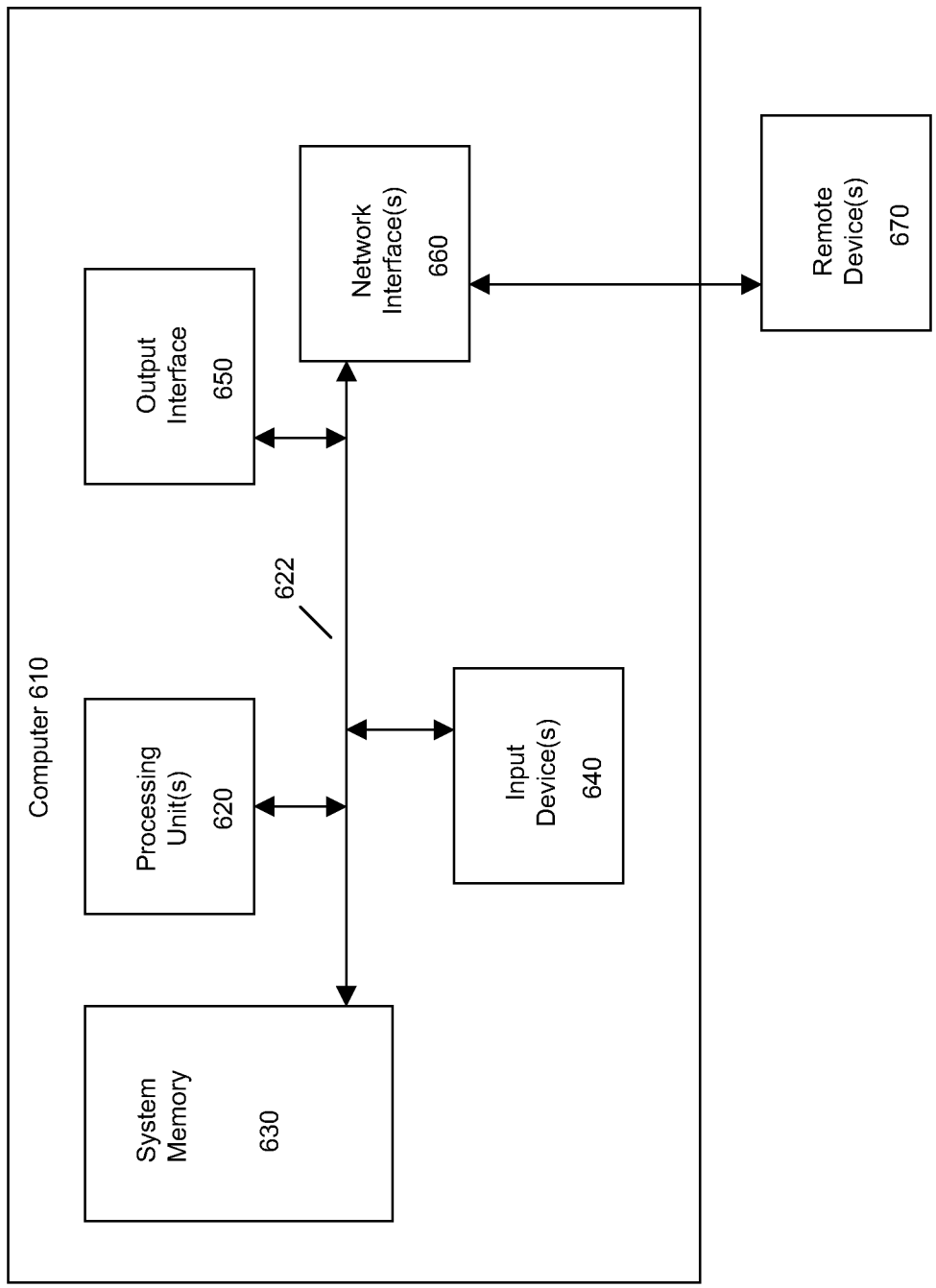
FIG. 6 illustrates an example computing device.

Referring to FIG. 6, it will be readily understood that certain embodiments can be implemented using any of a wide variety of devices or combinations of devices. An example device that may be used in implementing at least one embodiment includes a computing device in the form of a computer 610, which may correspond to a central server 150 as illustrated in FIG. 1. In this regard, the computer 610 may execute program instructions configured to access power consumption and other measurements from electricity grid devices, perform computations to determine phase(s) for electricity grid devices, and perform other functionality of the embodiments, as described herein.

Components of computer 610 may include, but are not limited to, at least one processing unit 620, a system memory 630, and a system bus 622 that couples various system components including the system memory 630 to the at least one processing unit 620. The computer 610 may include or have access to a variety of computer readable media. The system memory 630 may include computer readable storage media in the form of volatile and/or nonvolatile memory such as read only memory (ROM) and/or random access memory (RAM). By way of example, and not limitation, system memory 630 may also include an operating system, application programs, other program modules, and program data.

A user can interface with (for example, enter commands and information) the computer 610 through input devices 640. A monitor or other type of device can also be connected to the system bus 622 via an interface, such as an output interface 650. In addition to a monitor, computers may also include other peripheral output devices. The computer 610 may operate in a networked or distributed environment using logical connections (network interface 660) to at least one other remote computer or database (remote device(s) 670), as for example meter or monitoring devices such as 160 and 170, illustrated in FIG. 1. The logical connections may include a network, such local area network (LAN) or a wide area network (WAN), but may also include other networks/buses.

It should be noted as well that certain embodiments may be implemented as a system, method or computer program product. Accordingly, aspects may take the form of an entirely hardware embodiment, an entirely software embodiment (including firmware, resident software, micro-code, et cetera) or an embodiment combining software and hardware aspects that may all generally be referred to herein as a "circuit," "module" or "system." Furthermore, aspects may take the form of a computer program product embodied in at least one computer readable medium having computer readable program code embodied therewith.

Any combination of computer readable medium(s) may be utilized. The computer readable medium may be a non-signal computer readable medium, referred to herein as a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having at least one wire, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may can contain or store a program for use by or in connection with an instruction execution system, apparatus, or device.

Program code embodied on a computer readable medium may be transmitted using any appropriate medium, including but not limited to wireless, wireline, optical fiber cable, RF, et cetera, or any suitable combination of the foregoing.

Computer program code for carrying out operations for various aspects may be written in any combination of programming languages, including an object oriented programming language such as Java™, Smalltalk, C++ or the like and conventional procedural programming languages, such as the "C" programming language or similar programming languages. The program code may execute entirely on a single computer (device), partly on a single computer, as a stand-alone software package, partly on single computer and partly on a remote computer or entirely on a remote computer or server. In the latter scenario, the remote computer may be connected to another computer through any type of network, including a local area network (LAN) or a wide area network (WAN), or the connection may be made for example through the Internet using an Internet Service Provider.

Aspects have been described herein with reference to flowchart illustrations and/or block diagrams of methods, apparatuses, systems and computer program products according to example embodiments. It will be understood that the blocks of the flowchart illustrations and/or block diagrams, and combinations of blocks in the flowchart illustrations and/or block diagrams, can be implemented by computer program instructions. These computer program instructions may be provided to a processor of a computer or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer, or other programmable apparatus, provide processes for implementing the functions/acts specified in the flowchart and/or block diagram block or blocks.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Although illustrated example embodiments have been described herein with reference to the accompanying drawings, it is to be understood that embodiments are not limited to those precise example embodiments, and that various other changes and modifications may be affected therein by one skilled in the art without departing from the scope or spirit of the disclosure.

Appendix

In this APPENDIX the performance of relaxations and the correlation-based approach are illustrated, simply by way of example, using Monte-Carlo simulations. Example experiments were conducted with: (i) Random data sets in which each a meter reading was generated uniformly and independently at random; and (ii) data sets based on real electrical consumption profiles from Canada and Europe. In each data set, different types of errors were introduced and LP/QP relaxations were solved using CPLEX from within Matlab. CPLEX has a number of different optimizers for both linear quadratic programming, the dual simplex optimizer was used in both cases. For no errors case the relaxation (LP1) in equation (11) was used. For the case of errors, the unconstrained and constrained QP relaxations: (QP1) and (QP2), and the LP relaxation (LP2) were used. It was observed that QP2 yields better results than (QP1) even with $\lambda$ as high as $10^8$. Besides (QP2) was very fast in CPLEX, in fact faster than the implementation of QP1 in Matlab and therefore (QP2) was chosen for experiments.

Random Datasets

Figure 7E:
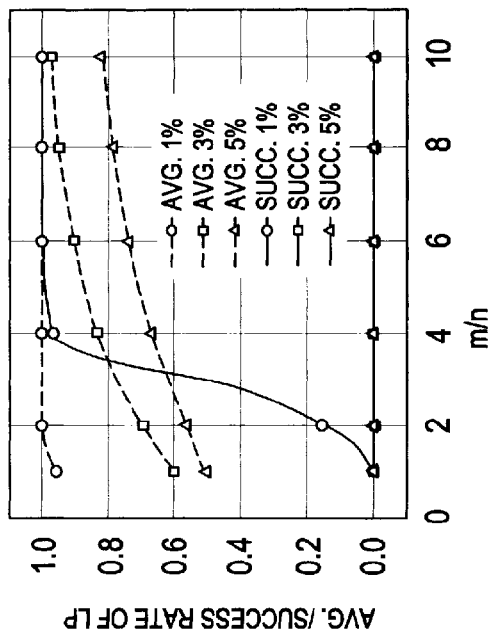
FIG. 7 (a-v) illustrates example experimental results for phase determination.
Figure 7F:
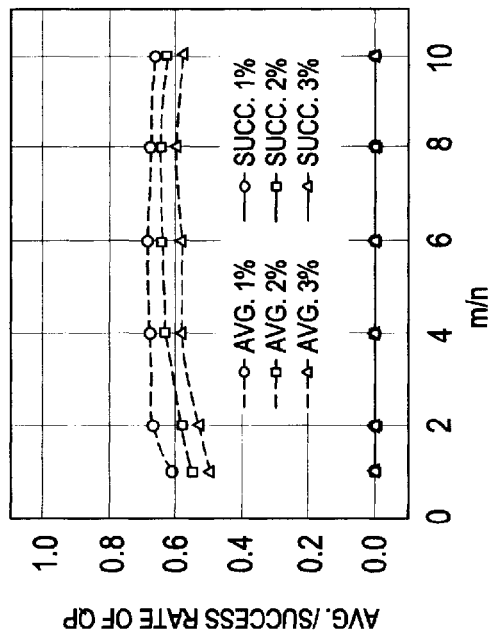

No Errors: For experiments with no errors, meter readings were generated from standard normal distribution in order to relate the work with the analytical results derived in previous works. Similar results were seen when meter readings were generated as in the case of errors below. FIG. 7(a) shows the success rate of the (LP1) in yielding the true integer solution over 100 runs. The curves on the left show the case for even assignment when homes are assigned phases uniformly with probability $\frac{1}{3}$. It can be appreciated that when m>0.4n, the success rate of LP1 increases and soon reaches 1. The transition from 0 to 1 is steeper, like when the number of homes is large. The curves on the right show the results for the worst case assignment when two of the phases are assigned one home each and the balance are assigned to the third uniformly at random. As already noted, the phase identification problem has three systems of linear equations, one for each phase, $HX_j=P_j$ s.t. $\Sigma_j X_j=1_n$, j$\in$J, each with n variables and m equations. In case of even assignment, when either of the three systems has a unique solution, the probability that the full system has a unique solution increases. However, in the worst case assignment, the probability that the system yields a unique integer solution depends entirely on the system with largest number of homes and therefore the transition from 0 to 1 occurs later when m/n=$\frac{1}{2}$.

Errors: For experiments with errors, each meter reading r is generated independently and uniformly at random in the range [100, 200] Wh. The range was intentionally kept narrow in order to bring out the worst case behavior, a wider range yields better results. Homes were assigned phases uniformly at random and three different types of errors were introduced: (1) Gaussian Errors (2) Gaussian random walk, and (3) Clock skew. The quality of rounded integer solutions obtained from QP2 and LP2 were tested.

Gaussian Errors: In case of Gaussian errors, each home and phase reading r was made erroneous by introducing a Gaussian error whose standard deviation is proportional to the size of the meter reading, that is, the erroneous reading $r'=N(\mu=r, \sigma=fr)$, f$\in$[1,5]%. A large load implies a large error. It was assumed that these errors may have resulted from line losses, loss of synchronization, or other sources.

FIGS. 7(b-c) show the performance of QP2 with 50 and 250 homes respectively. The continuous lines plot the success rate of yielding the true solution while the dotted ones show the average number of homes that are correctly assigned over 25 runs. When the number of homes is large, individual errors add up causing large deviations in E=MX−P, which explains the lower performance seen in FIG. 7(c). For 1% error, for 250 homes, 4n=1000 measurements are needed for the relaxation to yield the true solution. FIG. 7(d) shows the results for 250 homes when the range of meter readings is larger: [100, 500] Wh. FIG. 7(e,f) show the performance of LP2 which is relatively weaker compared to QP2, as minimal L2 norm solution is a better estimate of the true underlying solution when errors are normally distributed.

One of the main sources of errors expected is the error due to loss of synchronization. To simulate these errors, it was assumed that a measurement setup in which meters are read every $\Delta t$=15 minutes (900 sec). Two experiments were conducted that mimic the loss of synchronization by accumulating errors over time.

Gaussian random walk: For Gaussian random walk a standard deviation was assumed that is proportional to the size of measurement interval $\Delta t$. A standard deviation of 1% means that, after each interval of $\Delta t$=900 seconds, the random walk can jump by a value that lies $\epsilon$[−3$\sigma$, 3$\sigma$]=[−27, 27] seconds. This is a very high error. The corresponding erroneous meter readings are obtained by moving appropriate load mass between intervals assuming that load is uniformly distributed within each interval.

Figure 7G:
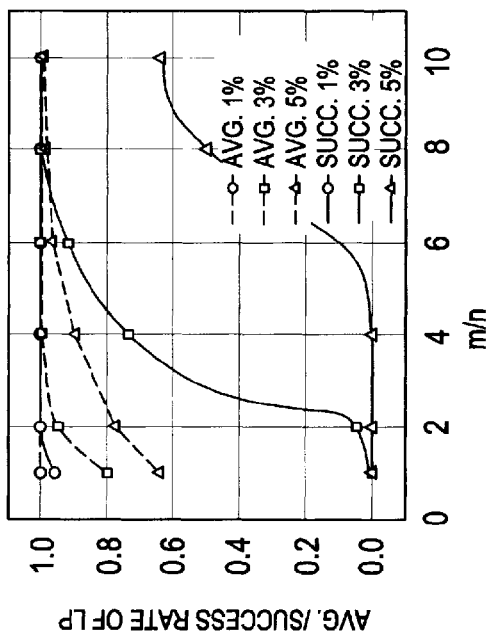
Figure 7H:
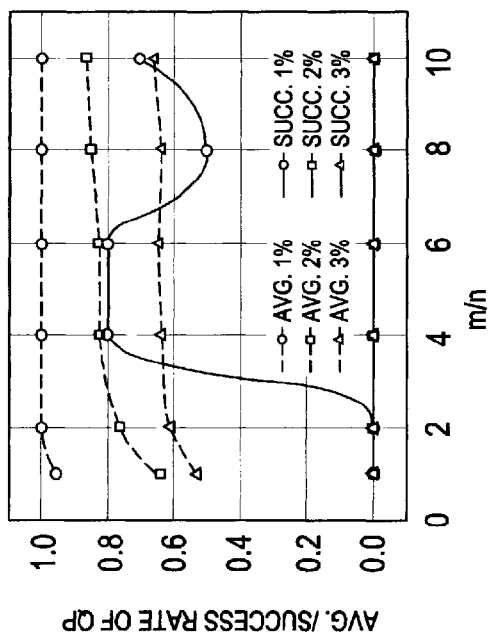
Figure 7I:
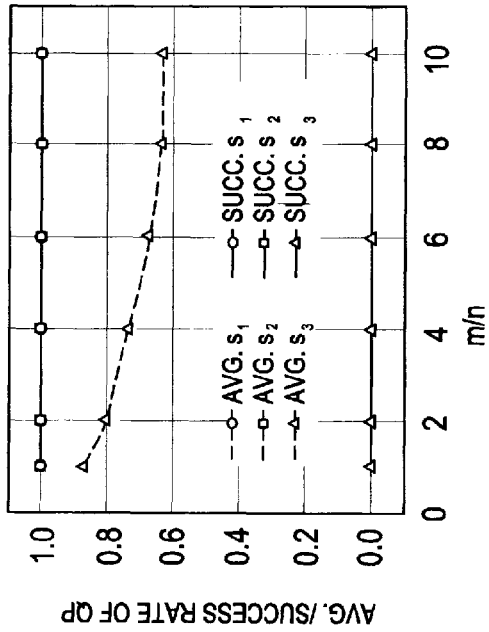
Figure 7J:
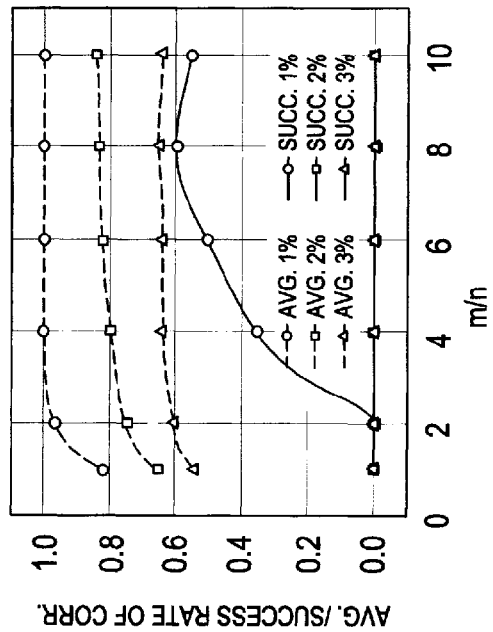
Figure 7K:
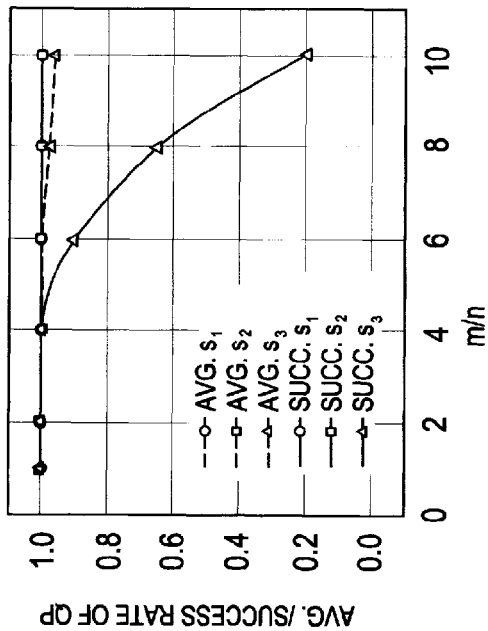
Figure 7L:
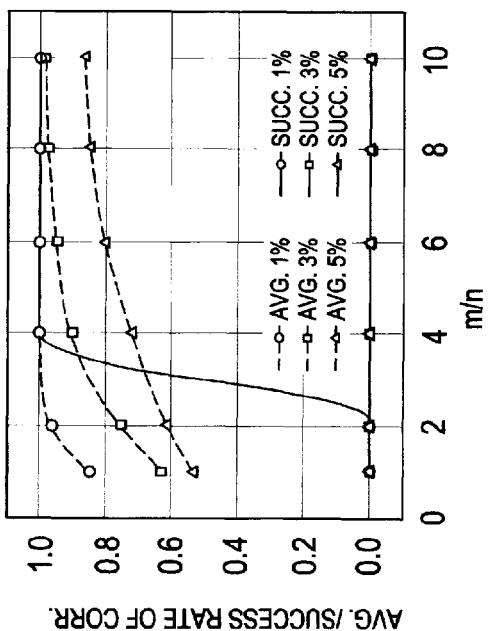
Figure 7M:
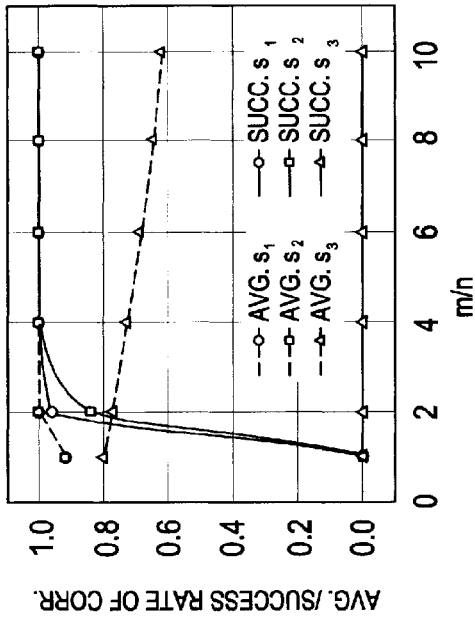
Figure 7N:
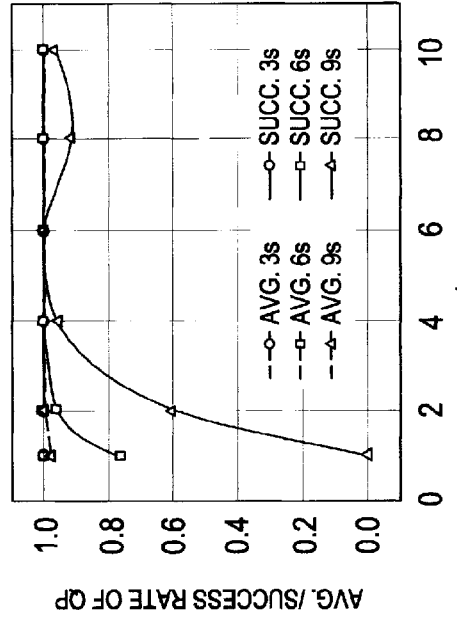
Figure 7O:
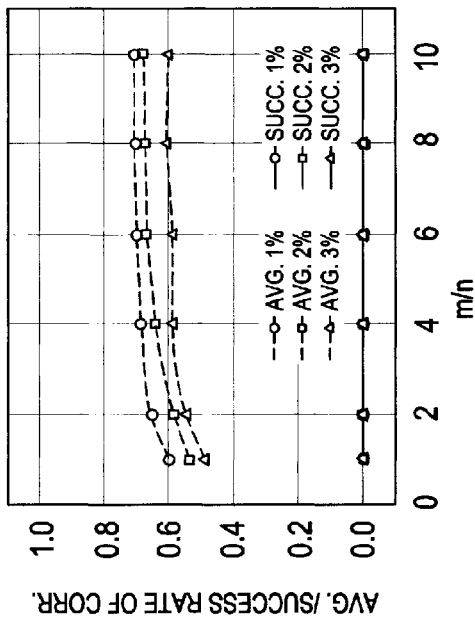
Figure 7P:
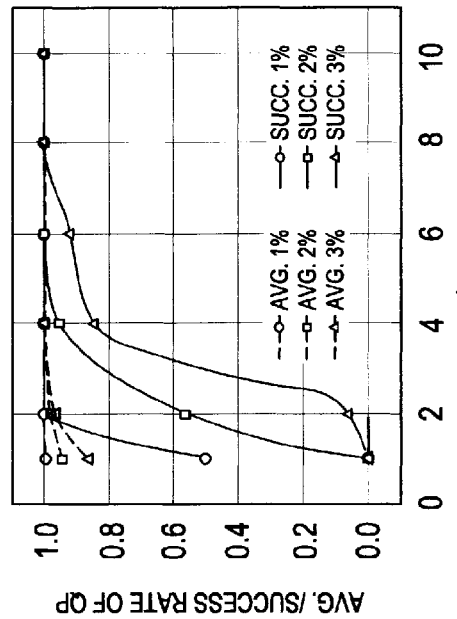
Figure 7Q:
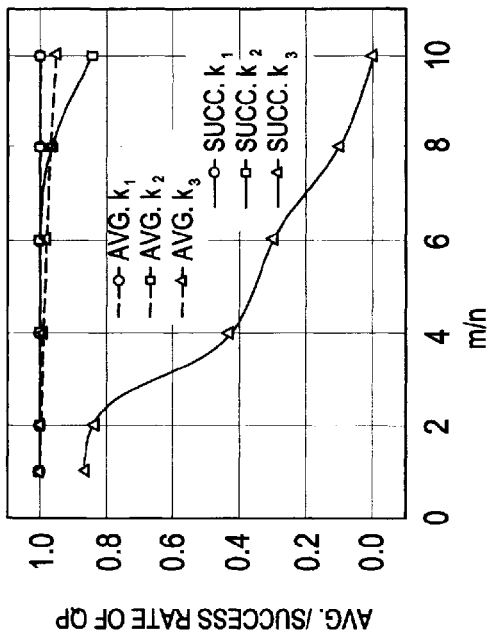
Figure 7R:
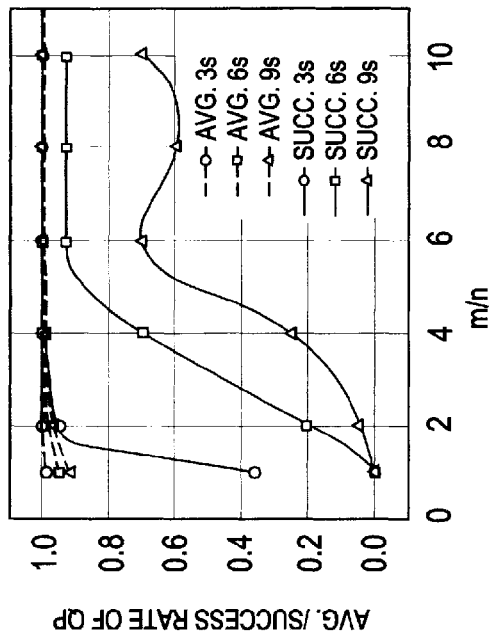
Figure 7S:
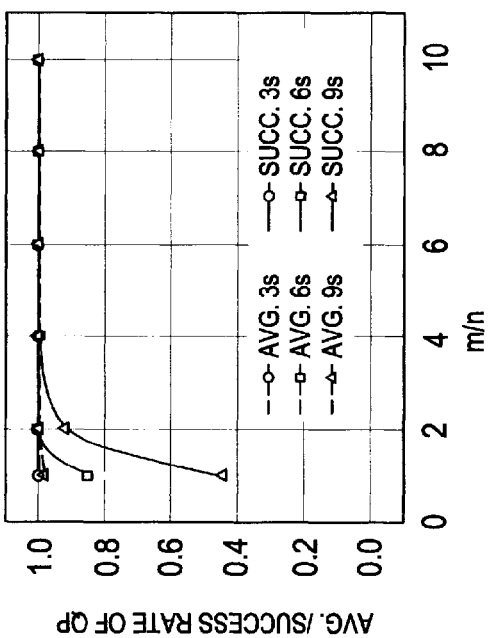
Figure 7T:
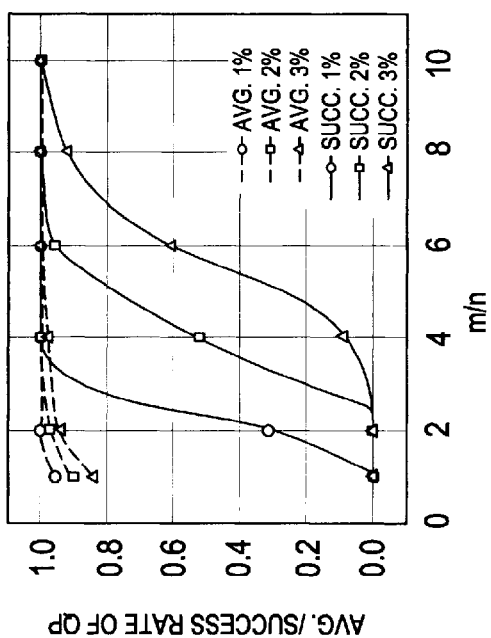
Figure 7V:
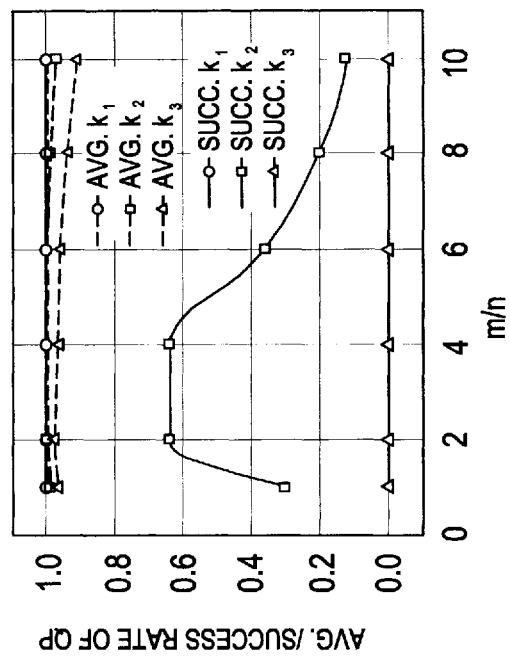
Figure 7U:
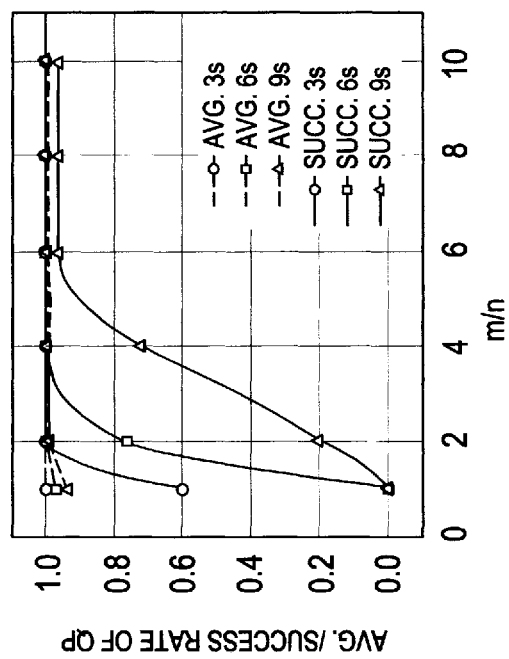

FIG. 7(g) shows the performance of QP2 for 250 homes for Gaussian random walk. Fluctuations and slow convergence can be observed. FIG. 7(h) shows results for the case when the random walk for each meter proceeds in one direction only (either positive or negative, but not both). It can be seen that the average number of correct assignments continues to remain low and more measurements do not imply better results. However, note that the errors simulated in these random walks were extremely high.

Clock Skew: Clock skew results when a clock's frequency differs from that of the true clock. Assuming no drift, the slope of a true clock is 1 and that of an erroneous clock is 1+s. To determine a value for s, note that for 250 homes up to 2500 measurements were conducted. With $\Delta t=15$ minutes, it takes≈26 days to collect these. If after 26 days, the smart meter's clock exceeds the true clock by 90 seconds then $s=4\times10^{-5}$. For each meter, a skew is assigned that is uniformly distributed in an interval corresponding to a time difference of [−90, 90] sec s(1), [−900, 900] sec s(2), or [−9000, 9000] sec s(2). FIG. 7(i, j) show the results for 50 and 250 homes respectively. For 90 and 900 seconds, the relaxation yields the true solutions. However, for very large skew, more measurements imply more accumulated errors and therefore incorrect solutions. FIG. 7(k-n) show the results for statistical correlations for 250 homes for the four error cases: Gaussian errors, Gaussian random walks (bi and uni-directional), and clock skew. The performance is slightly weaker compared to QP2, noting that the correlation method requires very little computation.

Real Datasets

In these example experiments, datasets were constructed from actual energy consumption profiles collected in the context of the 'Integration of Micro-Generation and Related Energy Technologies in Buildings' project. The data is publicly available and documents representative energy consumption profiles of households in Canada and Europe. The following datasets were used: (1) 'Canadian Measured Electrical Load Profiles' where $\Delta t=15$ min and (2) 'European Electrical Specific Profiles' where $\Delta t=5$ min. Datasets (1) and (2) have 7 and 3 annual consumption profiles and these were used to cut out measurements for 140 and 150 homes, respectively. This was done by allocating measurements worth a fixed number of consecutive days to each home. Time alignment was maintained; however, the experiments may benefit from seasonal variations since one user's data may have been cut from summer months while other's from winter months.

Experiments were conducted with four different error cases with realistic parameters: (i) Gaussian errors with a std. deviation of 1-3% of measured load. (ii) Bi and uni-directional random walks with deviations of 3, 6, 9 seconds and (iii) Clock skew causing a resulting time gap of 90 (k1), 900 (k2), or 1800(k3) seconds. FIG. 7(o-r) show the results for dataset (1) and FIG. 7(s-v) for dataset (2).

Overall trends similar to those seen in randomly generated datasets were seen. The results of dataset (1) are better than that of (2). This happens since both the range of meter readings and $\Delta t$ is smaller for (2). Since absolute parameters were considered for random walks and skew, a 9 sec deviation is more serious if $\Delta t=5$ min than if $\Delta t=15$ min. For Gaussian errors (FIG. 7(o, s)), for 3% standard deviation, about 10n measurements are required for QP2 to yield the true solution. For random walk errors (FIG. 7(p, q, t, u)) with a 3 sec standard deviation, not more than 4n measurements are needed to obtain the true solution. Lastly, clock skew is serious only if it is high (FIG. 7(r,v)).

Computational Performance

In terms of computational performance, QP2 is much faster than LP2. One of the reasons for this is that LP2 has (3m+3n) variables that scale with the number of measurements m. In QP2, the number of variables remain fixed 3n even when measurements increase. In the example experiments with CPLEX on a linux machine (2.53 GHz, Intel CoreTM2 Duo processor T9400, Memory 3 GB), QP2 outputs fractional solutions within a few seconds while LP2 can take tens of seconds for 250 homes. Based on preliminary experiments with small number of homes (<=50) with CPLEX's MIP solver that uses branch and bound search methods, even the ILP of equation (20) performs slower relative to the integer quadratic program of equation (16). This is because branch and bound search methods solve a sequence of relaxations across the search path in the tree. For up to about 50 homes, the linearization approaches discussed herein do not outperform the basic integer quadratic program of equation (16).

What is claimed is:

1. A computer program product for phase determination in an electricity grid comprising:
   a non-transitory computer readable storage medium having computer readable program code embodied therewith, the computer readable program code comprising:
   computer readable program code configured to access power consumption measurements derived from a supply electricity grid device that supplies power at a plurality of phases;
   computer readable program code configured to access power consumption measurements derived from a set of demand electricity grid devices connected in the electricity grid to the supply electricity grid device;
   computer readable program code configured to determine a phase of at least one demand electricity grid device in the set of demand electricity grid devices via:
   measuring, for a set of different time intervals over a series of time intervals, a total power consumed from the supply electricity grid device and power consumed individually by ones in the set of demand electricity grid devices;
   identifying the set of time intervals for which said measuring is performed;
   thereupon comparing the total power consumed from the supply electricity grid device with the power consumed individually by ones in the set of demand electricity grid devices with respect to the series of time intervals in total, using measurements from the set of different time intervals in the series; and
   thereupon determining a phase of at least one demand electricity grid device in the set of demand electricity grid devices, via employing calculations from said measuring and comparing steps; and
   computer readable program code configured to output the determined phase for at least one demand electricity grid device in the set of demand electricity grid devices.

2. The computer program product according to claim 1, wherein said comparing further comprises utilizing time series measurements derived from the set of demand electricity grid devices and time series measurements derived from the supply electricity grid device that are synchronized.

3. The computer program product according to claim 1, further comprising computer readable program code configured to apply data filtering procedures in selecting measurement sets to determine a phase of at least one demand electricity grid device in the set of demand electricity grid devices.

4. The computer program product according to claim 3, wherein the data filtering procedures include at least one of: filtering based on time of day, filtering based on day; filtering based on load error; and filtering based on meter readings.

5. The computer program product according to claim 1, further comprising computer readable program code configured to apply preprocessing procedures to prepare measurements for said comparing.

6. The computer program product according to claim 5, wherein to apply preprocessing procedures to prepare measurements for said comparing further comprises accumulating measurements prior to said comparing responsive to determining that the measurements derived from the supply electricity grid device and the measurements derived from the set of demand electricity grid devices are not synchronized in time.

7. The computer program product according to claim 1, wherein said comparing further comprises employing dynamic programming to identify a sub-set of demand electricity grid devices within the set of demand electricity grid devices having measurements that sum up to measurements of a phase of the plurality of phases derived from the supply electricity grid device.

8. The computer program product according to claim 7, wherein said employing dynamic programming is repeated until a phase of the plurality of phases is identified for a unique of sub-set of demand electricity grid devices within the set of demand electricity grid devices.

9. The computer program product according to claim 1, wherein said comparing further comprises employing a linear systems approach to determine a phase of the plurality of phases for the at least one demand electricity grid device in the set of demand electricity grid devices.

10. The computer program product according to claim 1, wherein said comparing further comprises employing at least one of:
   a linear programming approach;
   a mixed integer linear programming approach;
   a quadratic programming approach;
   a mixed integer quadratic programming approach; and
   a correlation-based statistical method.

11. The computer program product according to claim 1, wherein to output further comprises:
   determining that measurements contain errors; and
   outputting multiple likely phase determinations.

12. The computer program product according to claim 1, wherein:
   the supply electricity grid device comprises a low voltage transformer;
   the set of demand electricity grid devices comprise buildings receiving power from the low voltage transformer; and
   the measurements comprise periodic synchronous measurements of:
      voltage, current, and power for each phase of the low voltage transformer; and
      elapsed kilowatt hours at the buildings.

13. A method for phase determination in an electricity grid comprising:
   utilizing at least one processor to execute computer code configured to perform the steps of:
   receiving at a computing device power consumption measurements derived from a supply electricity grid device that distributes power at a plurality of phases;
   receiving at the computing device power consumption measurements derived from a set of demand electricity grid devices connected in the electricity grid to the supply electricity grid device;
   determining a phase of at least one demand electricity grid device in the set of demand electricity grid devices via:
      measuring, for a set of different time intervals over a series of time intervals, a total power consumed from the supply electricity grid device and power consumed individually by ones in the set of demand electricity grid devices;
      thereupon comparing the total power consumed from the supply electricity grid device with the power consumed individually by ones in the set of demand electricity grid devices, with respect to the series of time intervals in total using measurements from the set of different time intervals in the series; and
      thereupon determining a phase of at least one demand electricity grid device in the set of demand electricity grid devices, via employing calculations from said measuring and comparing steps; and
   outputting with the computing device the determined phase for at least one demand electricity grid device in the set of demand electricity grid devices.

14. The method according to claim 13, wherein said comparing further comprises utilizing time series measurements derived from the set of demand electricity grid devices and time series measurements derived from the supply electricity grid device that are synchronized.

15. The method according to claim 13, further comprising applying data filtering procedures in selecting measurement sets to determine a phase of at least one demand electricity grid device in the set of demand electricity grid devices.

16. The method according to claim 15, wherein the data filtering procedures include at least one of: filtering based on different times of day, filtering based on days; filtering based on load error; and filtering based on identical meter readings.

17. The method according to claim 13, further comprising applying preprocessing procedures to prepare measurements for said comparing.

18. The method according to claim 17, wherein applying preprocessing procedures to prepare measurements for said comparing further comprises accumulating measurements prior to said comparing responsive to determining that the measurements derived from the supply electricity grid device and the measurements derived from the set of demand electricity grid devices are not synchronized in time.

19. The method according to claim 13, wherein said comparing further comprises employing dynamic programming to identify a sub-set of demand electricity grid devices within the set of demand electricity grid devices having measurements that sum up to measurements of a phase of the plurality of phases derived from the supply electricity grid device.

20. The method according to claim 19, wherein said employing dynamic programming is repeated until a phase of the plurality of phases is identified for a unique of sub-set of demand electricity grid devices within the set of demand electricity grid devices.

21. The method according to claim 13, wherein said comparing further comprises employing a linear systems approach to determine a phase of the plurality of phases for the at least one demand electricity grid device in the set of demand electricity grid devices.

22. The method according to claim 13, wherein said comparing further comprises employing at least one of:
   a linear programming approach;
   a mixed integer linear programming approach;
   a quadratic programming approach;
   a mixed integer quadratic programming approach; and
   a correlation-based statistical method.

23. The method according to claim 13, wherein said outputting further comprises:
   determining that measurements contain errors; and
   outputting multiple likely phase determinations.

24. The method according to claim 13, wherein:
   the supply electricity grid device comprises a low voltage transformer;
   the set of demand electricity grid devices comprise buildings receiving power from the low voltage transformer; and
   the measurements comprise periodic synchronous measurements of:

voltage, current, and power for each phase of the low voltage transformer; and elapsed kilowatt hours at the buildings.

25. A system for phase determination in an electricity grid comprising:

at least one processor; and a memory device operatively connected to the at least one processor;

wherein, responsive to execution of program instructions accessible to the at least one processor, the at least one processor is configured to:

access power consumption measurements derived from a supply electricity grid device that distributes power at a plurality of phases;

access power consumption measurements derived from a set of demand electricity grid devices connected in the electricity grid to the supply electricity grid device;

determine a phase of at least one demand electricity grid device in the set of demand electricity grid devices via:

measuring, for a set of different time intervals over a series of time intervals, a total power consumed from the supply electricity grid device and power consumed individually by ones in the set of demand electricity grid devices;

thereupon comparing the total power consumed from the supply electricity grid device with the power consumed individually by ones in the set of demand electricity grid devices, with respect to the series of time intervals in total using measurements from the set of different time intervals in the series; and thereupon determining a phase of at least one demand electricity grid device in the set of demand electricity grid devices, via employing calculations from said measuring and comparing steps; and output the determined phase for at least one demand electricity grid device in the set of demand electricity grid devices.

* * * * *